United States Patent [19]

Hayakawa

[11] Patent Number: 5,350,945
[45] Date of Patent: Sep. 27, 1994

[54] COIN-SHAPED INTEGRATED CIRCUIT MEMORY DEVICE

[75] Inventor: Tomihiro Hayakawa, Sayama, Japan

[73] Assignee: Casio Computer Co., Ltd., Tokyo, Japan

[21] Appl. No.: 992,866

[22] Filed: Dec. 17, 1992

[30] Foreign Application Priority Data

Dec. 18, 1991 [JP]  Japan .................................. 3-354600
Dec. 27, 1991 [JP]  Japan ............................. 3-113869[U]

[51] Int. Cl.⁵ .......................................... H01L 23/02
[52] U.S. Cl. .................................... 257/679; 257/730;
                                       257/693; 368/88; 360/60
[58] Field of Search .............. 257/679, 681, 685, 695,
         257/693, 698, 699, 730, 697; 360/60; 361/397,
                              398, 399, 737, 748, 749; 368/88

[56] References Cited

U.S. PATENT DOCUMENTS

| | | | |
|---|---|---|---|
| 4,064,552 | 12/1977 | Angelucci et al. | 361/414 |
| 4,288,841 | 9/1981 | Gogal . | |
| 4,437,718 | 3/1984 | Selinko . | |
| 4,463,971 | 8/1984 | Hoppe et al. . | |
| 4,649,418 | 3/1987 | Uden . | |
| 4,737,602 | 4/1988 | Yamamoto | 200/16 D |
| 4,862,249 | 8/1989 | Carlson | 257/681 |
| 5,025,141 | 6/1991 | Bolan | 235/472 |
| 5,148,264 | 9/1992 | Satriano | 257/693 |

FOREIGN PATENT DOCUMENTS

62-188089 8/1987 Japan .
63-288343 11/1988 Japan .

*Primary Examiner*—Jerome Jackson
*Assistant Examiner*—Courtney A. Bowers
*Attorney, Agent, or Firm*—Frishauf, Holtz, Goodman & Woodward

[57] ABSTRACT

The invention relates to an integrated circuit memory device 1 in which connecting terminals 11b for transmitting signals between itself and an external device are provided on a bottom surface of a coin-shaped case 10 containing an integrated circuit memory chip 12. A changeover switch 20 for changing the memory chip 12 to a data-writing mode is provided at an outer peripheral side portion of the coin-shaped case 10. The switch 20 has an operation knob 24 located in a notch 13A formed in a ring-shaped core member 13 of the case 10, and a contact plate 22 formed integrally with the knob 24. The switch 20 selectively switches the memory chip 12 in a data-writing mode and in a data-writing protect mode. In the data-writing protect mode, the write (WR) signal supplied to a write terminal of a circuit substrate 11 is prevented from being input to a write electrode of the memory chip 12.

12 Claims, 7 Drawing Sheets

COIN-SHAPED INTEGRATED CIRCUIT MEMORY DEVICE

BACKGROUND OF THE INVENTION

1. Field of the Invention

This invention relates to a coin-shaped integrated circuit memory device in which a non-volatile memory chip is housed, and on an outer peripheral side portion of which write protect means is provided for preventing data from being written in the memory chip.

2. Description of the Related Art

An IC card is basically constructed by sealing an IC module housing an IC memory chip in a core member, and is formed to have the same size as a credit card having a magnetic record member, i.e., it has a size of 54 mm (width)×85.5 mm (length)×0.8 mm (thickness). The IC card further has a control circuit element for identifying its owner, in addition to a memory circuit element, so that it is distinguished from the memory card only with a memory function.

Memory cards are widely used in digital electronic devices such as electronic calculators, word processors, pocket computers, and electronic notebooks, etc. The memory card used in the digital electronic devices generally has the same size as the IC card, i.e., 54 mm×85 mm. However, it is thicker than the IC card, and hence the rigidity of the entire memory card is greater than the IC card. Further, there is a memory card which is half in size in comparison with the IC card. This memory card is, however, too large to be applied to a wrist watch-type electronic device. Since the wrist watch-type electronic device is portable, it would be very convenient for carry if the device has such functions as the above-described electronic calculator, word processor, pocket computer, and electronic notebook. In order to make compact the wrist watch type electronic device, it is preferable that a memory card to be employed therein is shaped like a coin or thin disk to accord with the shape of the device.

Further, in order to be received in such a small wrist watch type device, a coin-shaped integrated circuit memory device must have such a small size of 10 mm–20 mm (diameter)×1 mm–2 mm (thickness). A merely small integrated circuit memory device can be easily obtained by using a flip chip bonding method in which an integrated circuit memory chip obtained by dicing a wafer is directly bonded to a circuit substrate. An IC module formed by this method is employed in the above-described IC card. However, since the rigidity of the IC module is secured by a card-shaped core member, a safe rigidity cannot be obtained when the IC module is singly mounted in a device. In addition, since writing and reading data in and from an IC module incorporated in the IC card is conducted under control of a host computer, so that an operator has no means to selectively operate the IC module. As regards an integrated circuit memory device to be mounted in a compact electronic device for a consumer, the memory device would not be useful at all if the user cannot selectively operate in a data-writing or a data-reading.

SUMMARY OF THE INVENTION

This invention has been made to solve the above problem, and an object of this invention is to provide an integrated circuit memory device applicable to a small electronic device such as a wrist watch type electronic device.

To achieve the above object, the integrated circuit memory device of the invention comprises:

a circuit substrate having a terminal for data, a terminal for a power source, and a data-writing terminal for writing data;

a non-volatile integrated circuit memory chip having electrodes connected to the terminals, respectively, and being selectively changeable in a data-writing state and in a data-reading state in accordance with a data-writing signal and a data-reading signal respectively supplied to the data-writing terminal of the circuit substrate; and case means for fixing the circuit substrate with the terminals being exposed outside, and for housing the IC memory chip, the case means being shaped like a thin disk and having write protect means at an outer peripheral side portion thereof for preventing the IC memory chip from being set in the data-writing state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE INVENTION

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

First Embodiment

Figure 1:
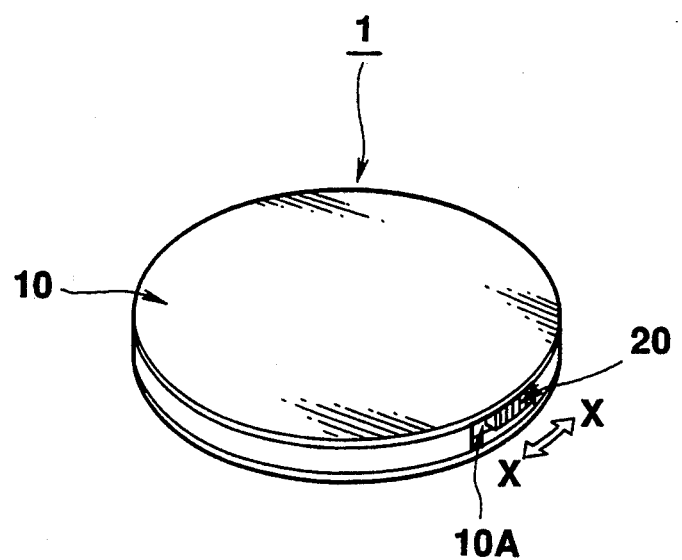
FIG. 1 is a perspective view, showing an external appearance of an integrated circuit memory device according to a first embodiment of the invention.

FIG. 1 is a perspective view, showing an external appearance of an integrated circuit memory device 1 (hereafter called "IC memory device") according to a first embodiment of the invention. The IC memory device 1 is shaped like a coin or thin disk, and has a diameter of 10 mm–20 mm and a thickness of 1 mm–2 mm. The memory device 1 has a disk-shaped case 10 containing an integrated circuit (IC) memory chip, described later, and a write-protect changeover switch 20 located in a depression 10A formed in one region of an outer peripheral side portion of the disk-shaped case 10.

Figure 2:
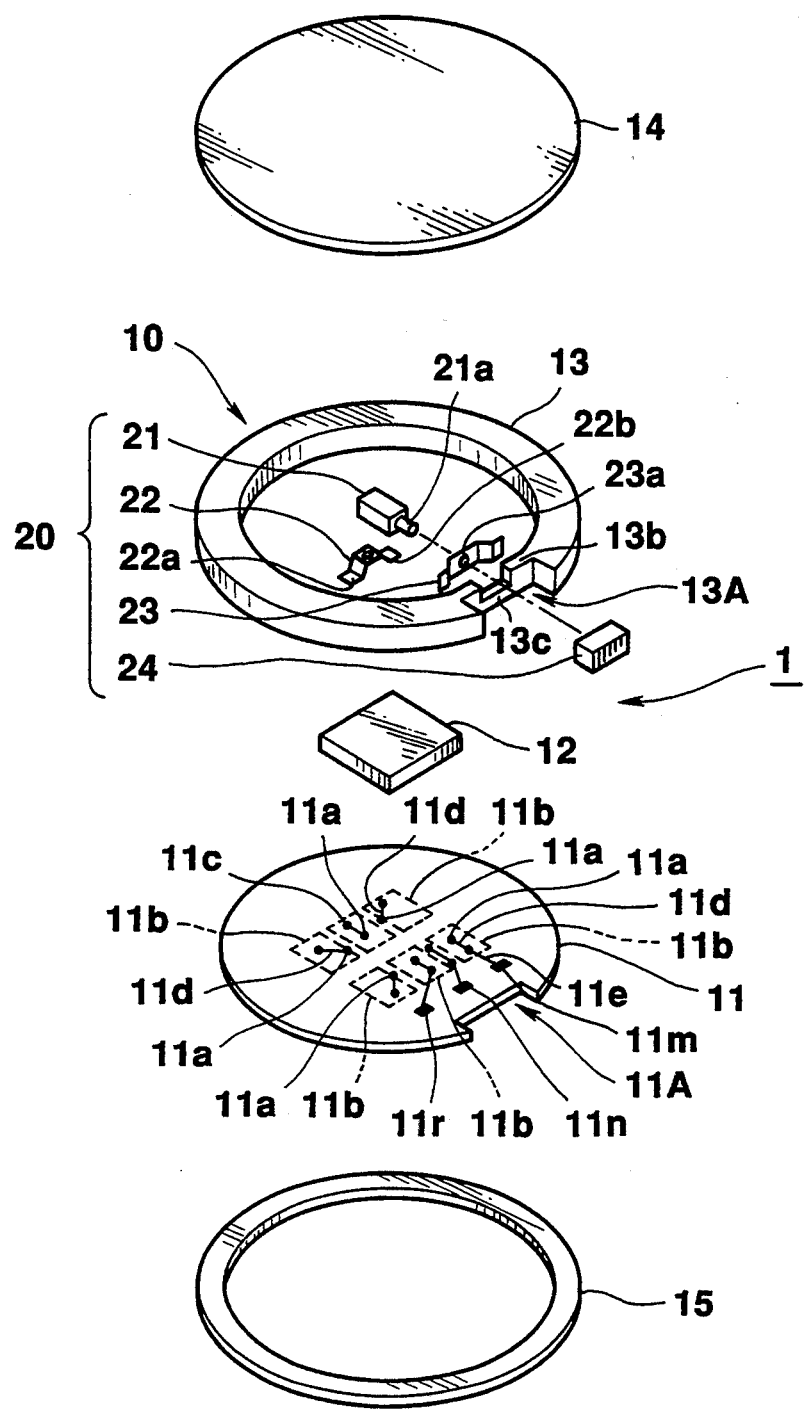
FIG. 2 is an exploded perspective view of the integrated circuit memory device of FIG. 1.

FIG. 2 is an exploded perspective view of the IC memory device 1 of FIG. 1. A structure of the device 1 will be explained in detail with reference to FIG. 2.

The IC memory device 1 is constructed by the disk-shaped case 10 composed of a core member 13 and an upper cover 14, an IC memory chip 12 having a plurality of input/output electrodes, a circuit substrate 11 on which the IC memory chip 12 is mounted, a changeover switch 20, and a ring 15.

On one surface of the IC memory chip 12, a nonvolatile IC memory element such as an EEPROM is formed, as well as electrodes for an address/data (A/D), a clock (CLK), a reset (RST), a power source (VDD), and a ground (GND) are formed, respectively.

On one surface of the base plate 11, bonding terminals 11a to be bonded to the electrodes of the IC memory chip 12 are formed, and on the other surface thereof connecting terminals 11b to be connected to probes provided in a wrist watch type electronic device are formed. Each bonding terminal 11a and each connecting terminal 11b are connected to each other through a through hole 11c and a lead 11d. Thus, the input/output electrodes of the IC memory chip 12 are connected to the electronic device via the connecting terminals 11b. The substrate 11 has a notch 11A for storing an operation knob of the changeover switch 20. Contact terminals 11m, 11n and 11r for mode-changing are formed on an edge portion in the vicinity of the match 11A of the base plate 11. The contact terminals 11m, 11n, and 11r are connected to predetermined terminals 11a for bonding via the leads 11e and 11d as shown in FIG. 2.

The core member 13 is made of a synthetic resin or a metal to have a ring shape, and is bonded to a peripheral edge portion of the substrate 11 after the IC memory chip 12 is mounted on the substrate 11. A notch 13A is formed in one region of an outer peripheral side portion of the core member 13. The notch 13A has the same size as that of the notch 11A of the substrate 11, and the core member 13 is secured to the substrate 11 such that the notches 11A and 13A are aligned with each other.

The notches 11A and 13A construct the depression 10A formed in the disk-shaped case 10 shown in FIG. 1, and the knob 24 of the switch 20 is received in the depression 10A such that it can move in a tangential direction of a peripheral side surface of the case 10 (in both directions indicated by a directional arrow X—X in FIG. 1). The core member 13 is provided with a narrow width portion 13b at its region corresponding to the notch 13A, and a depression 13c is formed in an upper end of the narrow width portion 13b. The changeover switch 20 is constructed by the operation knob 24 located outside the narrow width portion 13b, a contact-holding member 21 located inside the narrow width portion 13b, a contact plate 22 attached to a lower surface of the contact-holding member 21, and a plate spring 23. In the plate spring 23, a hole 23a, in which a pin 21a provided on one end side of the contact-holding member 21 is inserted, is formed. Thus, the switch 20 is assembled such that the pin 21a of the contact-holding member 21 is passed through the hole 23a of the plate spring 23 of the contact-holding member 21 and the depression 13c formed in the narrow width portion 13b of the core member 13 and is secured to the operation knob 24, with the contact plate 22 fixed to the lower surface side of the contact-holding member 21. When the operation knob 24 is moved in one of the directions indicated by the bi-directional arrow X—X, the plate spring 23, contact-holding member 21, and contact plate 22 move together with the knob 24, and accordingly the contacts 22a and 22b of the contact plate 22 move to positions in which the contact terminals 11n and 11m are connected to each other or the contact terminals 11n and 11r are connected to each other, respectively.

The upper cover 14 is formed by a thin metal plate made of aluminum, stainless, etc., and is adhered to an upper surface of the core member 13. Thus, the IC memory chip 12 is received in a space defined by the core member 13, upper cover 14, and circuit substrate 11, and sealded from the outside.

The ring 15 is made of a metal plate, and is bonded to the peripheral edge portion of the substrate 11. The ring 15 is for preventing the connecting terminals 11b 1 from being stained, being worn away during unused, and being applied with static electricity.

Figure 3:
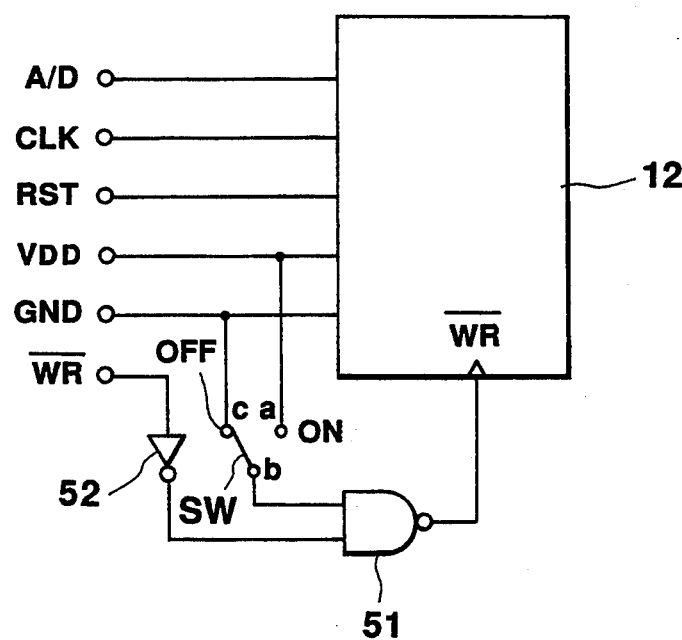
FIG. 3 is a circuit diagram, showing the integrated circuit memory device of FIG. 1.

FIG. 3 is a circuit diagram of the IC memory device of the invention, and explanation about FIG. 3 will be made in the following.

The IC memory device 1 is switched by a changeover switch SW in a data writing-enable state and in a data writing-disable state. As is shown in FIG. 3, the electrodes of the IC memory chip 12 are connected to the address/data (A/D) terminal, clock (CLK) terminal, reset (RST) terminal, power source (VDD) terminal, and ground (GND) terminal, respectively. The IC memory chip 12 has a write ($\overline{WR}$) electrode, and an output terminal of a NAND gate 51 is connected to the write ($\overline{WR}$) electrode. One input terminal of the NAND gate 51 is connected to the $\overline{WR}$ terminal via an inverter 52, and the other input terminal of the NAND gate 51 is selectively connected, by means of the changeover switch SW, to one of the power source (VDD) terminal and ground (GND) terminal.

The operation of the circuit shown in FIG. 3 will now be explained.

When a write signal $\overline{WR}$ is at "H" level, an "L" level signal output from the inverter 52 is input into the above described one input terminal of the NAND gate 51, so that voltage of "H" level is applied to the write ($\overline{WR}$) electrode of the IC memory chip 12, irrespective of whether the changeover switch SW is in an ON position in which a terminal a (shown in FIG. 3) is connected to a terminal b (shown in FIG. 3), or in an OFF position in which a terminal c (shown in FIG. 3) is connected to the terminal b. In such a data-reading state the data stored in the memory chip 12 is supplied to an external electronic device via the address/data (A/D) terminal in synchronism with a signal input from the clock (CLK) terminal.

When the write signal WR is at "L" level, the output of the inverter 52 is at "H" level, and hence the input to the above described one input terminal of the NAND gate 51 is at "H" level. At this time, if the changeover switch SW is located at the ON position, the other input terminal of the NAND gate 51 is supplied with a VDD electric potential of "H" level. Thus, the write ($\overline{WR}$) electrode of the IC memory chip 12 is supplied with a voltage of "L" level, thereby setting the write state in the chip. In this state, data supplied from the electronic device via the address/data (A/D) terminal is stored in the memory element of the memory chip 12.

If the changeover switch SW is located in the OFF position, the other input terminal of the NAND gate 51 is supplied with a GND electric potential of "L" level. Thus, the output of the NAND gate 51 becomes to have "H" level, and accordingly the write ($\overline{WR}$) electrode of the IC memory chip 12 is supplied with a voltage of "H" level, which sets the memory chip 12 in the reading state. That is, where the changeover switch SW is located at the OFF position, no write signals $\overline{WR}$ are supplied to the write ($\overline{WR}$) electrode of the memory chip 12, thereby setting the write-protect state. When the write-protect state is set by the user so as to protect data, unintentional deletion of data is successively avoided.

Although in the above-described first embodiment, the changeover switch for the write-protect 20 is provided inside the IC memory device 1, the memory device may be modified such that the changeover switch is provided outside the memory device, and that only a mechanism for controlling the changeover state of the switch is provided in the memory device 1. Such a modification will be explained below.

Second Embodiment

Figure 4:
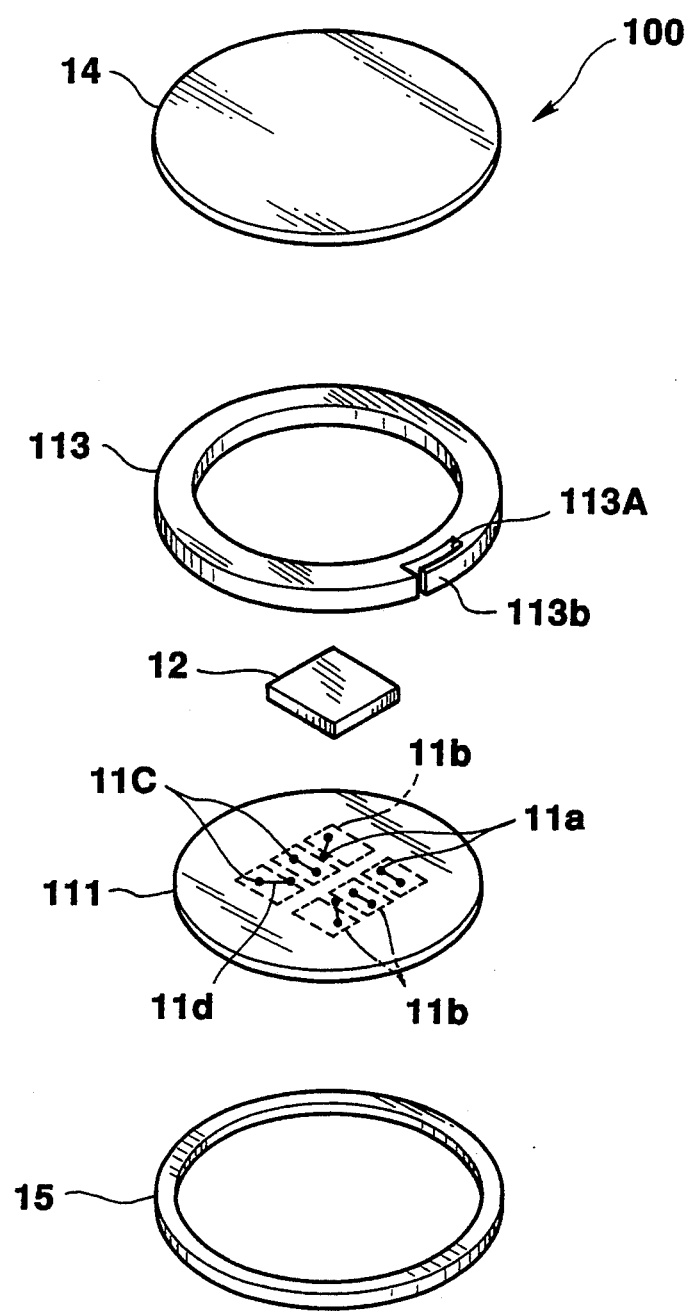
FIG. 4 is an exploded perspective view of an integrated circuit memory device according to a second embodiment of the invention.

FIG. 4 is an exploded perspective view showing an IC memory device 100 according to a second embodiment of the invention.

In this embodiment, a structure of a core member 113 and a structure of a circuit base plate 111 are different from those in the first embodiment. In particular, it should be noted that the IC memory device 100 has no member corresponding to the changeover switch 20 of the first embodiment. Further, in the second embodiment, the IC memory chip 12, upper cover 14, and ring 15 have the same structures as those in the first embodiment. Therefore, they are designated by the same reference numerals as those used in the first embodiment, and explanation thereof are omitted.

A notch 113A is formed in one part of an outer peripheral side portion of the core member 113. An outer peripheral surface side of the notch 113A is covered with a write-protect piece 113b as one part of a main body of the core member 113. The piece 113b is formed like a thin piece cut out at its front end side from the main body of the core member 113. Therefore, the piece 113b can be easily broken off at its base end as a connecting portion of the core member 13 from the main body of the core member 13 by inserting, through the notch 113A, a tip portion of a slender metal plate such as a screw driver, and pulling the metal plate toward outside or twisting the same.

The circuit substrate 111 has terminals for bonding 11a formed in one surface side thereof, connecting terminals 11b formed in the other surfaces side, through holes 11c for connecting upper and lower surfaces of the substrate, and leads 11d, as in the first embodiment. However, the base plate 111 has neither notches corresponding to the notch 113A of the core member 113, nor terminals corresponding to the contact terminals 11m, 11n, and 11r in the first embodiment.

Figure 5:
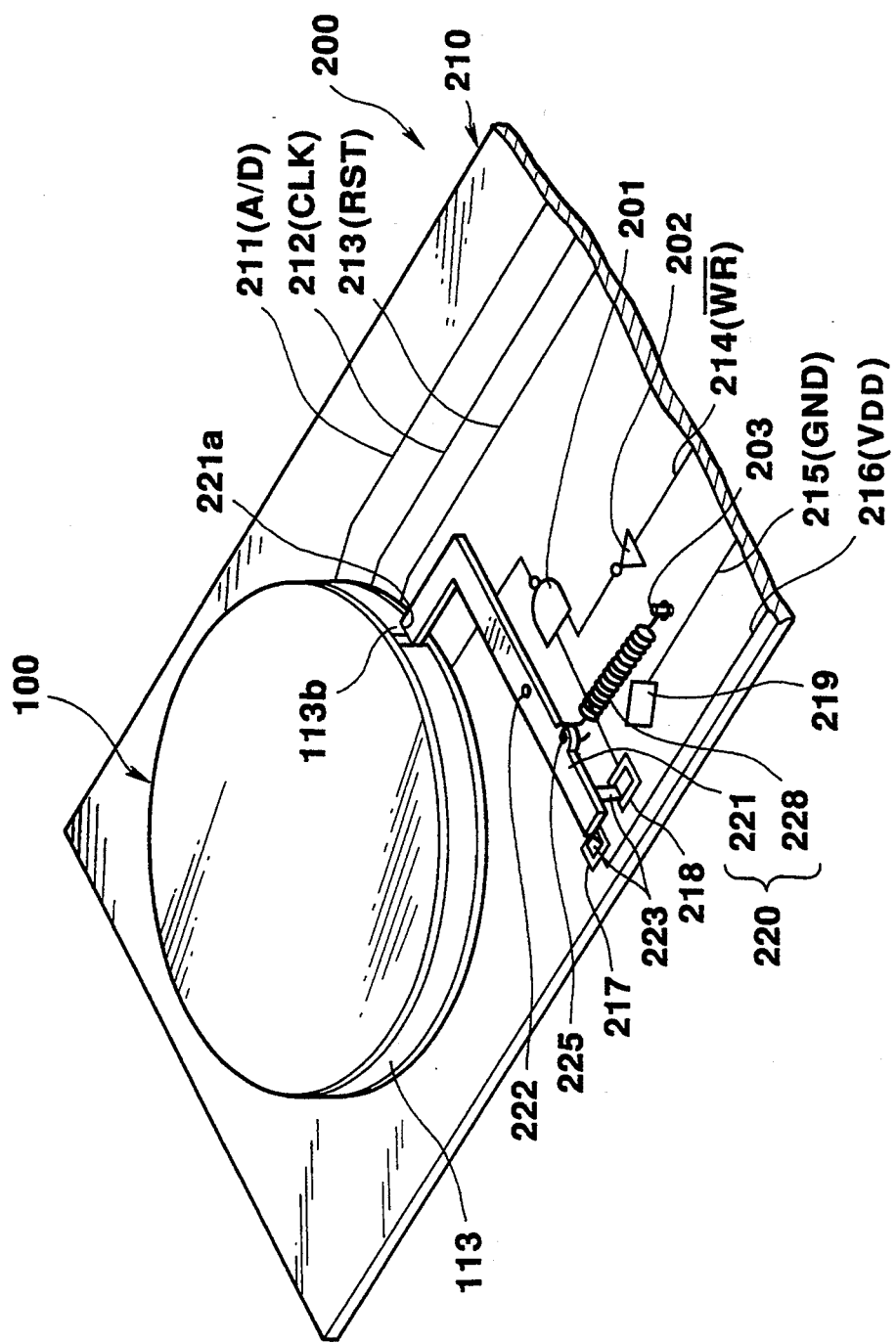
FIG. 5 is a perspective view, showing a state where the integrated circuit memory device of FIG. 4 is mounted in a memory mounting portion of an electronic device.

FIG. 5 is a perspective view showing a state where the integrated circuit memory device 100 of FIG. 4 is mounted in a memory mounting portion 200 of an electronic device.

The memory mounting portion 200 has a circuit substrate 210 and a changeover switch 220.

An address/data (A/D) line 211, a clock (CLK) signal line 212, a reset (RST) signal line 213, a write (WR) signal line 214, a ground (GND) line 215, and a power source (VDD) line 216 are formed on the circuit substrate 210, and a NAND gate element 201 and an inverter element 202 are mounted on the same. The write (WR) signal line 214 is connected to one input terminal of a NAND gate element 201 via an inverter element 202. An output terminal of the NAND gate element 201 is connected to the write ($\overline{WR}$) electrode of the IC memory chip 12 via the predetermined connecting terminal 11b formed on the circuit substrate 111 of the IC memory device 100. On the circuit substrate 210 an ON-contact 217, a common-contact 218, and an OFF-contact 219 are further formed. The ON-contact 217 is connected to a power source (VDD) line, and the OFF-contact 219 is connected to the ground (GND) line 215. The common-contact 218 is connected to the other input terminal of the NAND gate element 201.

The changeover switch 220 has a rotary plate 221 and a spring 228. The rotary plate 221 is formed by an "L" shaped plate, and is supported by a supporting axis 222 so as to be rotatable in the counterclockwise direction in FIG. 1. A contact plate 223 is secured to one end of the rotary plate 221. A hole 225 is formed in the rotary plate 221 at a position between the securing point of the contact plate 223 and the supporting point on the supporting axis 222. One end of a tension spring 228 is inserted in the hole 225, and the other end of the tension spring 228 is secured to a pin 203 projecting through the circuit substrate 210. A rotational force in the counterclockwise direction is always applied to the rotary plate 221 by a tension force of the spring 228. As a result, a tip portion 221a of the rotary plate 221 bent into an L-shape is kept in a state such that it contacts to the write protect piece 113b formed in the core member 113 of the IC memory device 100. In this state, the contact plate 223 secured to the rotary plate 221 electrically connects the ON-contact 217 to the common-contact 218, thereby applying the VDD electric potential to the other input terminal of the NAND gate element 201.

Figure 6:
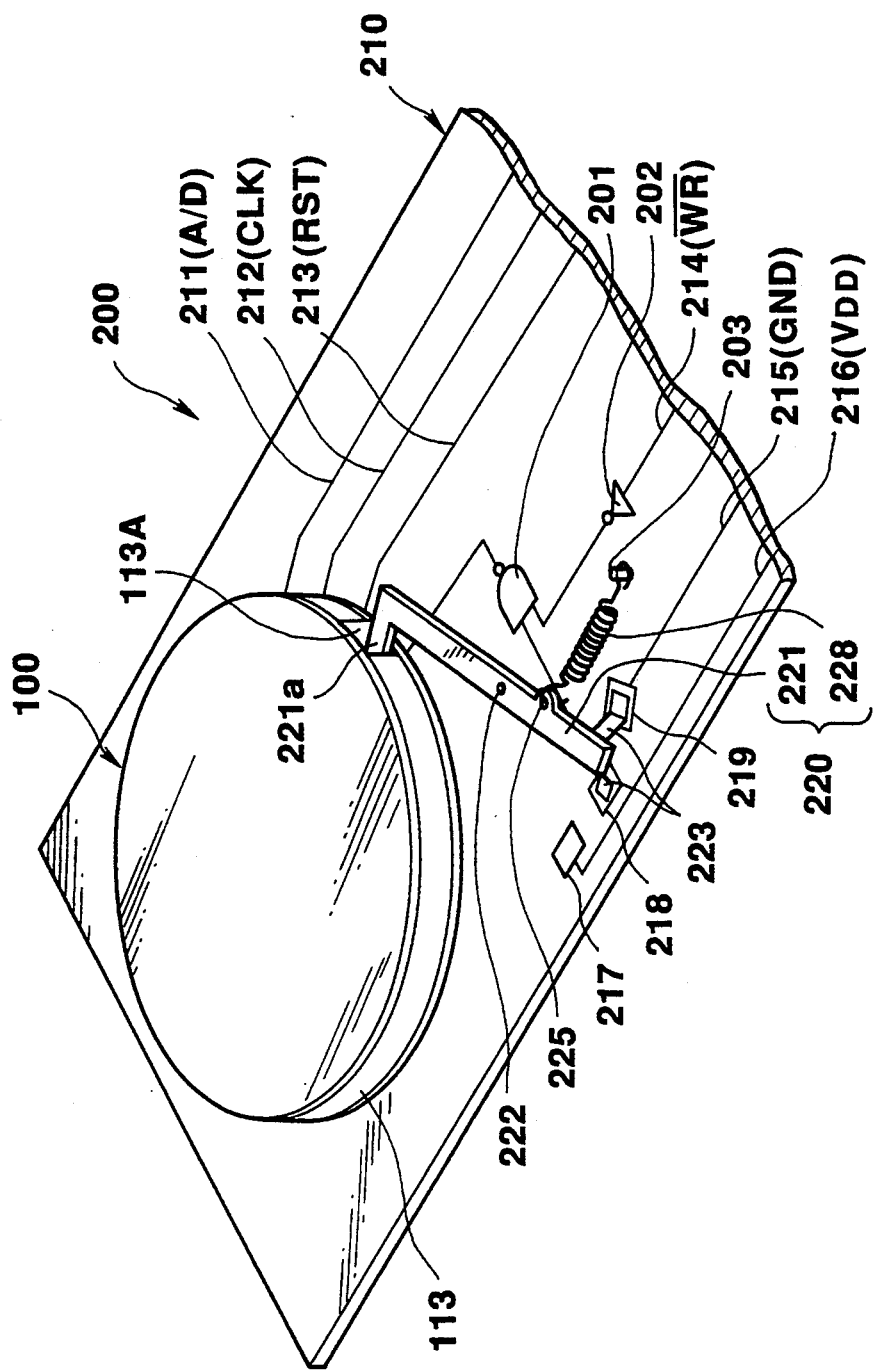
FIG. 6 is a perspective view, showing a state where the integrated circuit memory device of FIG. 4 is mounted in the memory mounting portion of the electronic device of FIG. 5 after a write-protect piece is removed from the integrated circuit memory device of FIG. 4.

FIG. 6 is a perspective view showing a state where the IC memory device 100 is mounted in the memory mounting portion 200 of the electronic device after the write-protect piece 113b is removed from the core member 113 of the IC memory device 100. In the state, since there is no write protect piece 113b, the tip portion 221a of the rotary plate 221 bent like an L-shape can enter into the notch 113A of the core member 113, and the rotary plate 221 is rotated in the counterclockwise direction by the tension spring 228, and is set in the state shown in FIG. 6. In this position after the rotary plate 221 is so made a rotary movement as described above, the contact plate 223 secured to one end of the rotary plate 113 electrically connects the common-contact 218 to the OFF-contact 219, thereby applying the GND electric potential to the other input terminal of the NAND gate element 201.

Figure 7:
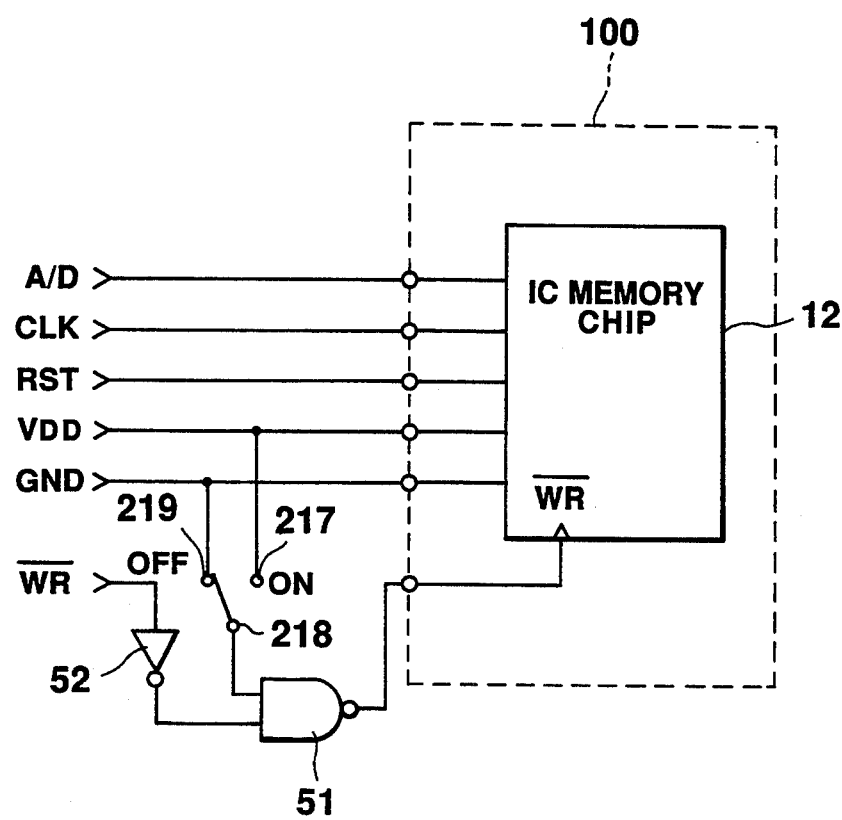
FIG. 7 is a circuit diagram of the integrated circuit memory device and the memory mounting portion shown in FIGS. 5 and 6.

FIG. 7 is a circuit diagram of the IC memory chip 12 and memory mounting portion 200. An interior circuit of the IC memory device 100 is surrounded by a broken line, and the NAND gate 51 and inverter 52 are provided outside the memory device 100. One input terminal of the NAND gate 51 is supplied with the write signal WR via the inverter 52. Accordingly, as in the first embodiment, when the write signal WR is at "H"

level the write (WR) electrode of the IC memory chip 12 is supplied with an electrical potential of "H" level, irrespective of whether the contact plate 223 secured to the rotary plate 221 is located at a position in which the contact plate 223 connects the common-contact 218 to the ON-contact 217, or it is located at a position in which it connects the common-contact 218 to the OFF-contact 219. This is a data-reading state.

However, where the write (WR) signal is at "L" level and the above described one input terminal of the NAND gate 51 is supplied with an electric potential of "H" level via the inverter 52, the circumstances differ from the above. If in a state that the write protect piece 113b of the IC memory device 100 exists as shown in FIG. 5, the VDD electric potential of "H" level is supplied to the other input terminal of the NAND gate 51 via the ON-contact 217 and common-contact 218. Accordingly, the write (WR) electrode of the IC memory chip 12 is supplied with a low electric potential, resulting in a data-writing state. If the write protect piece 113b is removed from the IC memory device 100, a state shown in FIG. 6 is set so that the GND electric potential of "L" level is supplied to the other input terminal of the NAND gate 51 via the OFF-contact 219 and common-contact 218. Thus, the write (WR) electrode of the IC memory chip 12 is not supplied with the low electric potential, and hence the memory device 100 cannot be set in the writing state.

In summary, in the IC memory device 100 of this embodiment, for writing data, it is only mounted on the memory mounting portion 200 of the electronic device and the write signal WR is supplied thereto to store data. Then, for keeping the written data, the write protect piece 113b is removed. Since the IC memory device 100 with the write protect piece 113b being removed is necessarily in the state shown in FIG. 6 when it is mounted on the memory mounting portion 200, further writing of data is prevented even if such an erroneous operation that a further write signal is supplied from the control portion of the electronic device is conducted. Thus keeping stored data in a reliable manner.

Although in the above embodiment, the write protect piece 113b and core member 113 are integrally formed as one piece, they may be formed as separate members. In this case, it may be possible that these separate members can be detachably connected by providing freely engageable engagement pieces thereto.

Additional advantages and modifications will readily occur to those skilled in the art. Therefore, the invention in its broader aspects is not limited to the specific details, and representative device shown and described herein. Accordingly, various modifications may be made without departing from the spirit or scope of the general inventive concept as defined by the appended claims and their equivalents.

What is claimed is:

1. An integrated circuit memory device without a battery adapted to be stored in an electronic device having a control section and a battery and which is capable of attachment to a wrist of a user, comprising:
   a circuit substrate with two surfaces and having a data terminal, power terminals for a power source and a data-writing terminal for writing data, such terminals being formed on one of said two surfaces, connecting terminals formed on the other of said two surfaces, and through holes formed, respectively, between said data terminal, power terminals and data-writing terminal and said connecting terminals, said connecting terminals being, respectively, connected with said data terminal, said power terminals and said data-writing terminal through one of said through holes;
   a non-volatile integrated circuit memory chip having electrodes connected with said data terminal, power terminals and data-writing terminal, respectively, and being selectively changeable in a data-writing state and in a data-reading state in accordance with a data-writing signal and a data-reading signal respectively supplied to said data-writing terminal of said circuit substrate, said non-volatile integrated circuit memory chip being mounted on said circuit substrate;
   a case including a core member and a cover bonded to one surface of said core member, said cover being formed by a thin metal plate, said core member having a ring shape for storing therein said non-volatile integrated circuit memory chip and a perimeter having substantially a circular outer surface which includes a notch depressed from said circular outer surface, said circuit substrate being bonded to said core member at another surface side of said core member; and
   a changeover switch having a knob positioned in said notch of said core member for selectively setting one of a data-writing allowable state and a data-writing preventive state.

2. The integrated circuit memory device according to claim 1, wherein said changeover switch includes a contact holding member and a contact plate, and said circuit substrate has a contact terminal to be contacted with said contact plate.

3. The integrated circuit memory device according to claim 1, wherein said circuit substrate has substantially a circular shape and said connecting terminals are positioned substantially in a middle portion of said circuit substrate.

4. The integrated circuit memory device according to claim 3, wherein said circuit substrate has a notch at a portion corresponding to said notch of said core member.

5. The integrated circuit memory device according to claim 1, wherein said case further includes a ring bonded to said circuit substrate.

6. The integrated circuit memory device according to claim 5, wherein said ring is made of metal.

7. An integrated circuit memory device without a battery adapted to be stored in an electronic device having a changeover switch for setting one of a data-writing allowable state and a data-writing preventive state, comprising:
   a circuit substrate with two surfaces and having a data terminal, power terminals for a power source and a data-writing terminal for writing data, such terminals being formed on one of said two surfaces, connecting terminals formed on the other of said two surfaces, and through holes formed, respectively, between said data terminal, power terminals and data-writing terminal and said connecting terminals, said connecting terminals being, respectively, connected with said data terminal, said power terminals and said data-writing terminal through one of said through holes;
   a non-volatile integrated circuit memory chip having electrodes connected with said data terminal, power terminals and data-writing terminal, respectively, and being selectively changeable in a data-writing state and in a data-reading state in accordance with a data-writing signal and a data-reading signal respectively supplied to said data-writing terminal of said circuit substrate, said non-volatile integrated circuit memory chip being mounted on said circuit substrate; and a case including a core member and a cover bonded to one surface of said core member, said cover being formed by a thin metal plate, said core member having a ring shape for storing therein said non-volatile integrated circuit memory chip and a perimeter having substantially a circular outer surface, said core member including a piece which is movable or removable from said core member;

whereby the changeover switch sets the device in a data-writing preventive state depending on a movement or a removal of said piece of said core member.

8. The integrated circuit memory device according to claim 7, wherein said circuit substrate has substantially a circular shape and said connecting terminals are positioned substantially in a middle portion of said circuit substrate.

9. The integrated circuit memory device according to claim 7, wherein said core member has a notch for positioning said piece therein.

10. The integrated circuit memory device according to claim 9, wherein said circuit substrate has a notch at a portion corresponding to said notch of said core member.

11. The integrated circuit memory device according to claim 7, wherein said case further includes a ring bonded to said circuit substrate.

12. The integrated circuit memory device according to claim 11, wherein said ring is made of metal.

* * * * *